(12) United States Patent
Kasztenny

(10) Patent No.: US 11,598,800 B2
(45) Date of Patent: Mar. 7, 2023

(54) DISTANCE ELEMENTS FOR LINE PROTECTION NEAR UNCONVENTIONAL SOURCES

(71) Applicant: Schweitzer Engineering Laboratories, Inc., Pullman, WA (US)

(72) Inventor: Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/685,647

(22) Filed: Mar. 3, 2022

(65) Prior Publication Data

US 2022/0308103 A1    Sep. 29, 2022

Related U.S. Application Data

(60) Provisional application No. 63/166,065, filed on Mar. 25, 2021.

(51) Int. Cl.
   *G01R 31/08* (2020.01)
   *G01R 31/52* (2020.01)

(52) U.S. Cl.
   CPC .......... *G01R 31/086* (2013.01); *G01R 31/52* (2020.01)

(58) Field of Classification Search
   CPC . G01R 27/2629; G01R 35/005; G01L 1/2268; G01L 1/2281; G01L 19/0092; G01D 3/022; G01D 3/024; G01D 3/021
   USPC .......................................................... 324/509
   See application file for complete search history.

(56) References Cited

U.S. PATENT DOCUMENTS

| | | | |
|---|---|---|---|
| 4,342,064 A | 7/1982 | Wilkinson |
| 4,420,788 A | 12/1983 | Wilkinson |
| 4,686,601 A | 8/1987 | Alexander |
| 4,821,137 A | 4/1989 | Wilkinson |
| 5,140,492 A | 8/1992 | Schweitzer |
| 5,367,426 A | 11/1994 | Schweitzer |
| 5,790,418 A | 8/1998 | Roberts |
| 6,028,754 A | 2/2000 | Guzman-Casillas |
| 6,046,895 A | 4/2000 | Jurisch |
| 6,239,959 B1 | 5/2001 | Alexander |
| 8,410,785 B2 | 4/2013 | Calero |
| 8,675,327 B2 | 3/2014 | Kasztenny |

(Continued)

OTHER PUBLICATIONS

J.G. Andrichak, G.E. Alexander, "Distance Relay Fundamentals" Mar. 2007.

(Continued)

*Primary Examiner* — Farhana A Hoque
(74) *Attorney, Agent, or Firm* — Richard M. Edge

(57) ABSTRACT

Distance protection for electric power delivery systems that include an unconventional source is disclosed herein using apparent impedance independent of memory and cross-phase polarizing. The apparent impedance may be compared with an offset distance operating characteristic. Fault direction is determined by using zero-sequence ground directional logic for phase-to-ground faults. For phase-to-phase faults, fault direction is determined using weak-infeed directional logic. Fault direction may further use incremental quantity directional principles. The distance protection may further determine a faulted loop using voltage logic. The distance protection may select between traditional distance protection and the methods described herein based on the current feeding the fault.

22 Claims, 13 Drawing Sheets

(56) References Cited

U.S. PATENT DOCUMENTS

| | | | |
|---|---|---|---|
| 9,257,827 | B2 | 2/2016 | Calero |
| 9,941,684 | B2 | 4/2018 | Calero |
| 10,114,052 | B2 | 10/2018 | Kasztenny |
| 10,641,815 | B2 | 5/2020 | Kasztenny |
| 10,677,834 | B2 | 6/2020 | Kasztenny |
| 10,978,866 | B2 | 4/2021 | Kasztenny |
| 2006/0152866 | A1 | 7/2006 | Benmouyal |
| 2008/0239602 | A1 | 10/2008 | Kasztenny |
| 2020/0088780 | A1 | 3/2020 | Kasztenny |
| 2020/0103455 | A1 | 4/2020 | Kasztenny |
| 2020/0106261 | A1* | 4/2020 | Kasztenny ............... H02H 3/38 |

OTHER PUBLICATIONS

Edmund O. Schweitzer III, Bogdan Kasztenny, "Distance Protection: Why Have We Started with a Circle, Does it Matter, and What Else is Out There?" 44th Annual Western Protective Relay Conference, Oct. 2017.

Saeed Golestan, Josep M. Guerrero, "Conventional Synchronous Reference Frame Phase-Locked Loop is an Adaptive Complex Filter" IEEE Transactions on Industrial Electronics, vol. 62, No. 3, Mar. 2015.

Bogdan Kasztenny, Dale Finney, "Fundamentals of Distance Protection" 61st Annual Conference for Protective Relay Engineers, 2008.

Edmund O. Schweitzer III, Bogdan Kasztenny, Armando Guzman, Veselin Skendzic, Mangapathirao V. Mynam, "Speed of line protection—can we break free of phasor limitations?," 2015 68th Annual Conference for Protective Relay Engineers, 2015, pp. 448-461, doi: 10.1109/CPRE.2015.7102184.

Bogdan Kasztenny, Normann Fischer, Hector J. Altuve, "Negative-sequence differential protection—principles, sensitivity, and security," 2015 68th Annual Conference for Protective Relay Engineers, 2015, pp. 364-378, doi: 10.1109/CPRE.2015.7102180.

Bogdan Kasztenny, Mangapathirao V. Mynam, Normann Fischer, Armando Guzman, "Permissive or Blocking Pilot Protection Schemes? How to have it Both Ways", Presented at the 57th Annual Minnesota Power Systems Conference Virtual Format, Nov. 2021, Originally presented at the 47th Annual Western Protective Relay Conference, Oct. 2020.

Eugeniusz Rosolowski, Jan Izykowski, Bogdan Kasztenny, Murati Mohan Saha, "A New Distance Relaying Algorithm based on Complex Differential Equation for Symmetrical Components", Elsevier, Electric Power Systems Research 40 (1997).

Fernando Calero, Hector J. Altuve, "Identifying the Proper Impedance Plane and Fault Trajectories in Distance Protection Analysis", Originally presented at the 38th Annual Western Protective Relay Conference, Oct. 2011.

* cited by examiner

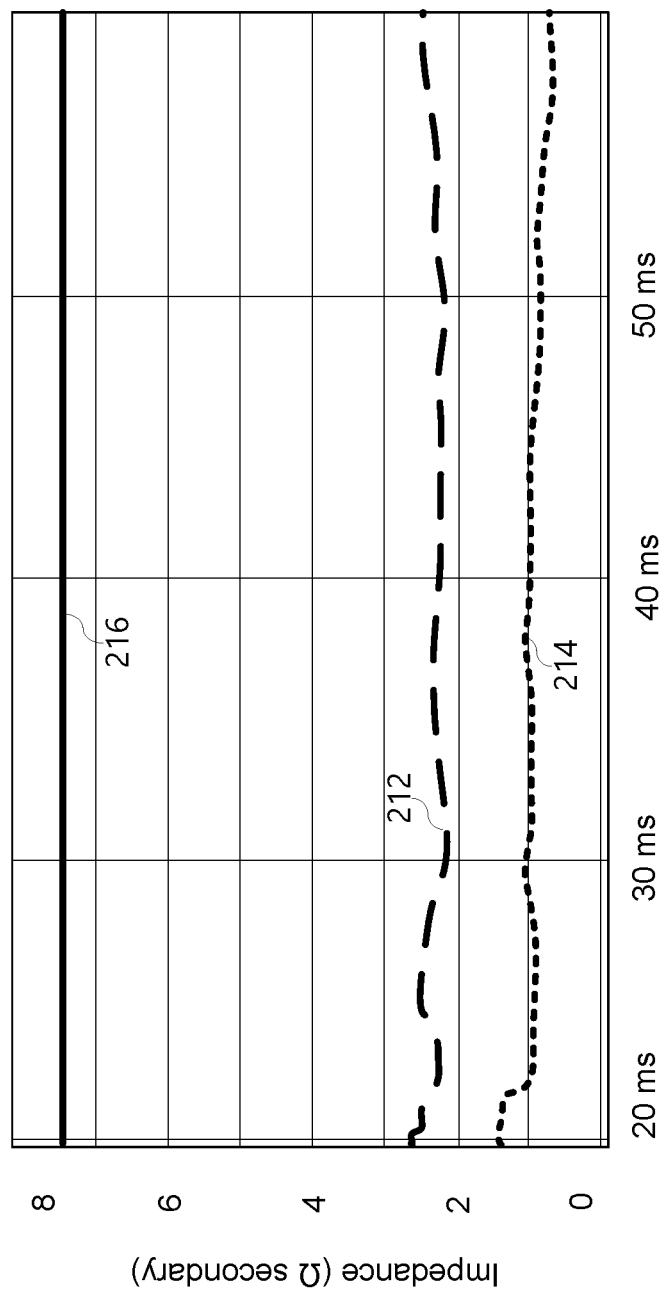

DISTANCE ELEMENTS FOR LINE PROTECTION NEAR UNCONVENTIONAL SOURCES

RELATED APPLICATION

This application claims priority from and benefit of U.S. Provisional Application Ser. No. 63/166,065 filed on 25 Mar. 2021 entitled "Distance Elements for Line Protection Near Unconventional Sources" which is hereby incorporated by reference in its entirety for all purposes.

TECHNICAL FIELD

This disclosure relates to distance protection of electric power delivery systems. More particularly, this disclosure relates to distance protection using apparent impedance independent of memory and cross-phase polarizing. Distance protection herein may use undervoltage elements for faulted-loop selection. Distance protection herein may include directional supervision using time-domain quantities or weak-infeed directional elements.

BRIEF DESCRIPTION OF THE DRAWINGS

Non-limiting and non-exhaustive embodiments of the disclosure are described, including various embodiments of the disclosure with reference to the figures, in which:

FIG. 2C illustrates resistance, reactance, an apparent impedance for the waveforms illustrated in FIGS. 2A and 2B.

DETAILED DESCRIPTION

Figure 1:
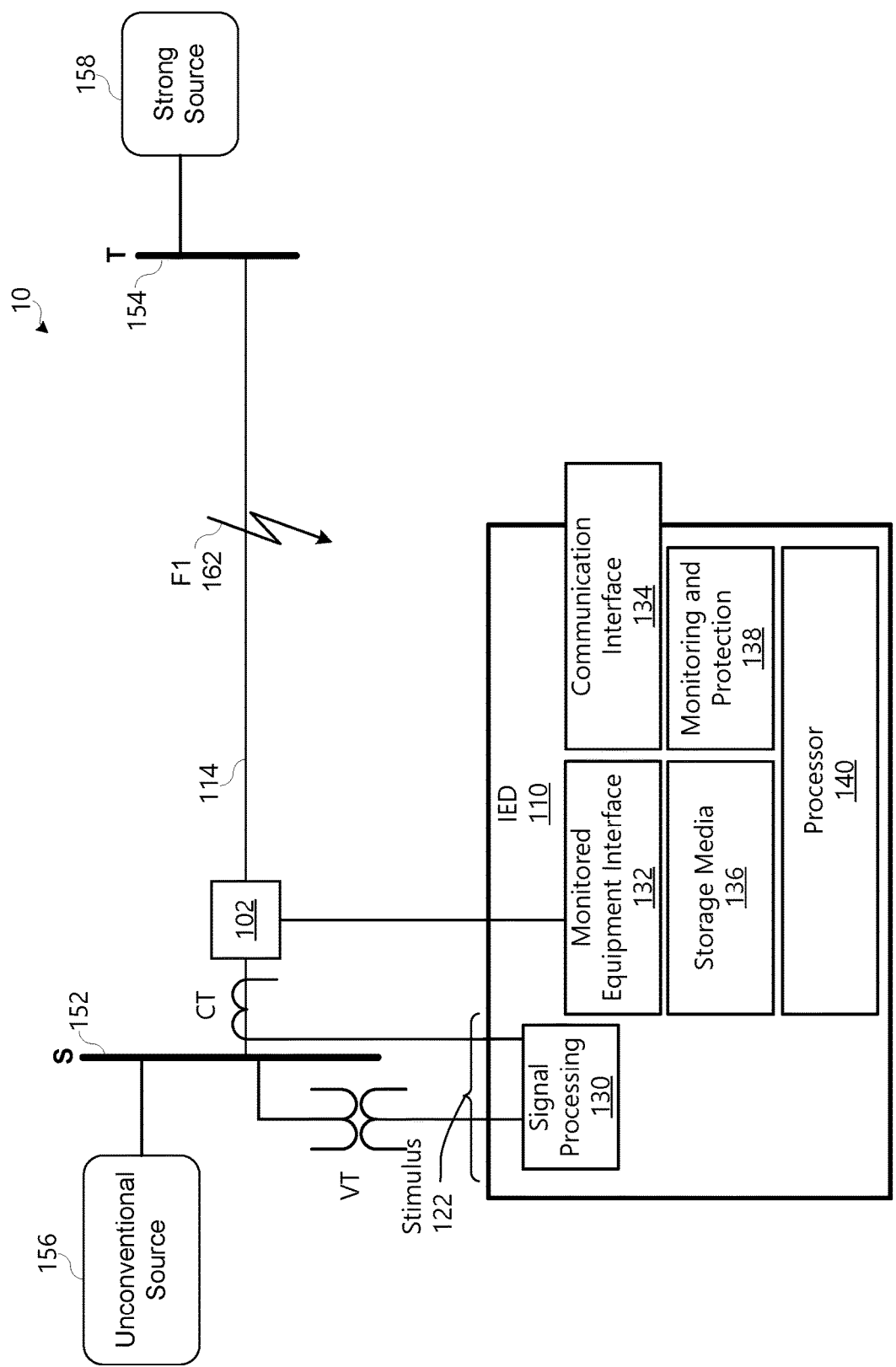
FIG. 1 illustrates a one-line diagram of an electrical power delivery system comprising Intelligent Electronic Devices (IEDs) implementing distance protection in accordance with several embodiments herein.

Electric power delivery systems are typically monitored and protected by IEDs that obtain electrical measurements such as voltage and current from the power system and use those measurements to determine a condition of the power system. IEDs may perform a protective action (such as signaling a circuit breaker to trip) under certain determined conditions. Traditionally, electric power delivery systems include synchronous generators, sources of electric power that respond to short circuit in a universal and well-understood way. Universal short-circuit responses have become the foundation for several system protection principles such as distance elements, directional elements, and faulted-loop selection logic. Each of these are key components in traditional line protection applications.

Unconventional sources are power sources that exhibit behavior during system faults that is considerably different than that of a synchronous generator. Presently, unconventional sources include several types of wind-powered induction generators as well as inverter-based sources such as photovoltaic-powered sources or newer types of wind-powered generators.

Unconventional sources create adverse operating conditions for distance elements in traditional line protection applications. During a line fault, the frequency of fault voltages and currents that an unconventional source supplies can significantly differ from the pre-fault frequency. This frequency difference challenges memory polarization in the mho distance element logic. Further, because the physics and control algorithms of an unconventional source, the negative-sequence current does not maintain a fixed relationship with the negative-sequence voltage at the source terminals. This unusual negative-sequence behavior can adversely affect traditional faulted-loop selection logic as well as the directional supervision in distance elements and the reactance comparator polarization in quadrilateral distance elements.

Accordingly, three tenants of distance protection become untrustworthy in the presence of unconventional sources: polarizing for determination of fault location; directional supervision; and faulted loop selection. Presented herein are systems and methods for distance protection of an electric power delivery system with unconventional sources. The systems and methods herein use alternative methods for polarizing for determination of fault location; directional supervision; and faulted loop selection that are reliable and secure even in systems with unconventional sources.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions. Software modules or components may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment.

FIG. 1 illustrates a one-line diagram of an electric power delivery system 10 fed by unconventional source 156 at terminal S 152 that is local to the considered distance relay 110 and a strong source 158 at terminal T 154 that is remote to the considered distance relay. Transmission line 114 connects terminal S 152 with terminal T 154. The system may include various other lines, branches, transformers, loads, and the like, but is illustrated in simplified form for ease of discussion herein. In various embodiments, line 114 may be monitored and protected using a system of IEDs that includes IED 110 and various other IEDs (not illustrated). Furthermore, the distance protection concepts described herein are implemented using power system signals from a single end of the system.

The IED 110 provides electric power system protection such as differential protection, distance protection, overcurrent protection, and the like. The illustrated IED 110 includes a processor 140 for executing computer instructions, which may comprise one or more general purpose processors, special purposes processors, application-specific integrated circuits, programmable logic elements (e.g., FPGAs), or the like. The IED 110 may further comprise non-transitory machine-readable storage media 136, which may include one or more disks, solid-state storage (e.g., Flash memory), optical media, or the like for storing computer instructions, measurements, settings and the like. In various embodiments the storage media 136 may be packaged with the processor 140, separate from the processor 140, or there may be multiple physical storage media 136 including media packaged with the processor 140 and media 136 separate from the processor 140.

The IED 110 may be communicatively coupled to other IEDs and/or supervisory systems either directly or using one or more communication networks via one or more communication interfaces 134. In some embodiments, the IED 110 may include human-machine interface (HMI) components (not shown), such as a display, input devices, and so on.

The IED 110 may include a plurality of monitoring and protection elements, described as a monitoring and protection module 138 that may be embodied as instructions stored on computer-readable media (such as storage media 136). The instructions, when executed on the processor 140, cause the IED to detect a fault and may also cause the IED to execute a protective action in response to the detected fault (e.g. signaling a circuit breaker to open the appropriate phases), display fault information, send messages including the fault information, and the like. Methods disclosed herein may generally follow the instructions stored on media for system protection.

The monitoring and protection module 138 may include an overcurrent element, a differential element, a distance element, and the like. The storage media 136 may include protective action instructions to cause the IED 110 to signal a circuit breaker 102 to open via the monitored equipment interface 132 upon detection of a fault condition.

The IED 110 may obtain electrical signals (the stimulus 122) from the power system 10 through instrument transformers (CTs, VTs, or the like). The stimulus 122 may be received directly via the measurement devices described above and/or indirectly via the communication interface 134 (e.g., from another IED or other monitoring device (not shown) in the electrical power system 10). The stimulus 122 may include, but is not limited to: current measurements, voltage measurements, equipment status (breaker open/closed) and the like.

The IED includes a signal processing module 130 to receive the electric power system signals and process the signals for monitoring and protection such as distance protection. Line currents and voltages are sampled at a rate suitable for protection, such as in the order of kHz to MHz. An analog-to-digital converter (ADC) may be included to create digital representations of the incoming line current and voltage measurements. The output of the ADC may be used in various embodiments herein. As described above, the voltage and/or current signals are used to detect faults and determine a protective action.

A monitored equipment interface 132 may be in electrical communication with monitored equipment such as circuit breaker 102. Circuit breaker 102 is configured to selectively trip (open). The monitored equipment interface 132 may include hardware for providing a signal to the circuit breaker 102 to open and/or close in response to a command from the IED 110. For example, upon detection of a fault 162 and determining that the fault is within the zone of protection, the monitoring and protection module 138 is configured to determine a protective action and effect the protective action on the power system by, for example, signaling the monitored equipment interface 132 to provide an open signal to the appropriate circuit breaker 102. Upon detection of the fault and determination that the fault is within the zone of protection, the IED 110 may signal other devices (using, for example, the network, or signaling another device directly by using inputs and outputs) regarding the fault, which other devices may signal a breaker to open, thus effecting the protective action on the electric power delivery system.

IED 110 is configured to detect faults on the electric power delivery system, determine if the fault is within a protected zone, and effect a protective action if the fault is within the protected zone. Accordingly, IEDs 110, 112 includes distance protection elements to determine a fault, determine if the fault is internal to the protected zone, and send a trip signal to circuit breaker 102. The distance element includes several components, including directional determination, faulted loop determination, and distance determination. The distance element in accordance with several embodiments herein is configured to retain integrity even when used to protect electric power systems with unconventional power sources 156.

Figure 2A:
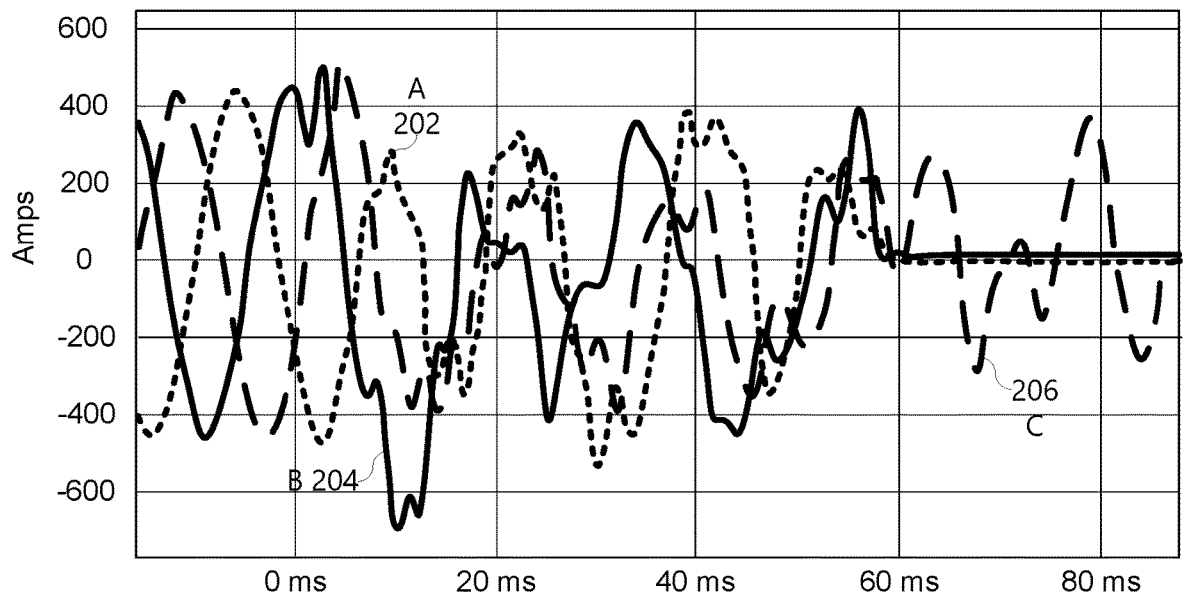
FIGS. 2A and 2B illustrate current and voltages collected from an electric power delivery system with unconventional sources during an event.
Figure 2B:
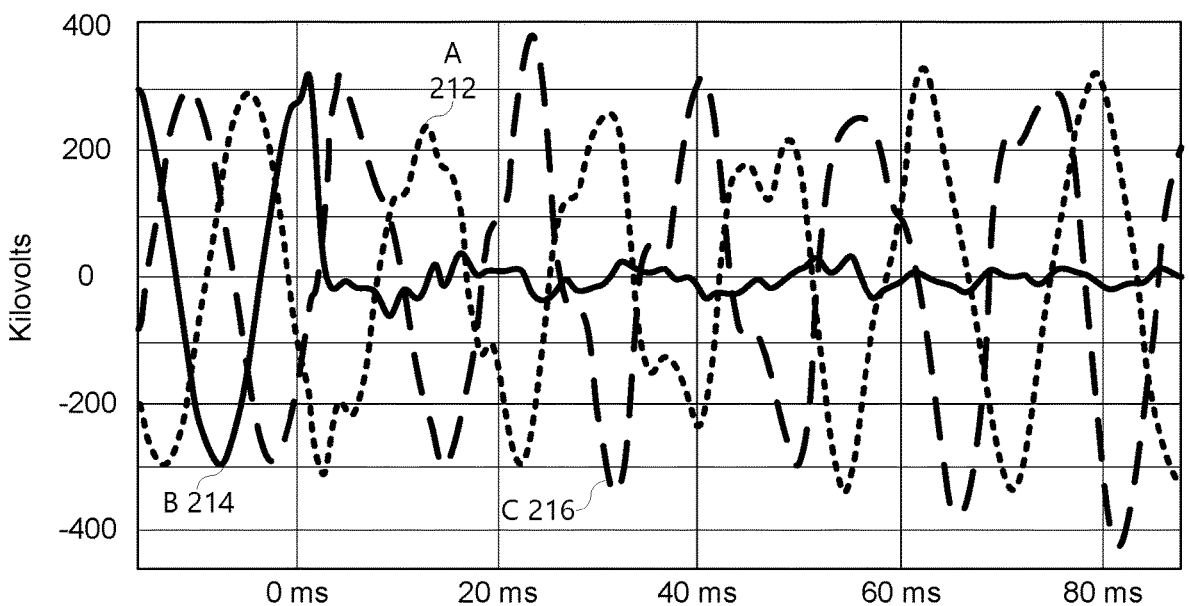

FIGS. 2A and 2B illustrate plots of current signals (FIG. 2A) and voltage signals (FIG. 2B) collected during a B-phase-to-ground fault at time stamp 0ms. As can be seen, the B-phase current 204 increases slightly during less than one full cycle, before decreasing somewhat erratically. The A-phase current 202 and C-phase current 206 also decrease somewhat. Turning to voltage, the B-phase voltage 214 drops sharply upon occurrence of the fault, and the voltages on the A-phase 212 and C-phase 216 remain relatively nominal in magnitude. As seen in FIGS. 2A and 2B, unusual current signal patterns are present when a fault is fed by an unconventional source as compared with a synchronous generator.

Both a synchronous generator and its prime mover (steam, hydro, or gas turbine) have a significant rotating mass. The large rotating mass provides high mechanical inertia for the generated electric power. When a fault occurs in the power network, the rotor of a synchronous generator continues to rotate at an unchanged speed for at least several hundred milliseconds before any appreciable change in speed occurs. This constant speed of rotation allows an IED to effectively track the phase angle of the equivalent voltage source that drives the fault current. This voltage phase angle in turn allows directional protection. This method of detecting fault current direction is especially beneficial when the IED cannot measure the phase angle of the fault voltage (when the fault voltage is low and its phase angle is unreliable). From a signal processing perspective, the operation of extrapolating the source voltage angle from pre-fault to fault conditions requires memorizing the pre-fault voltage phase angle and its rate of change (frequency), hence the label memory polarization.

Memory polarization is widely used in mho distance elements. Its primary purpose is to make the element reliably directional with a secondary benefit of improving dependability (coverage) for resistive faults through the effect of dynamic expansion of the operating characteristic. Memory polarization of mho distance elements provides security and dependability for close-in three-phase metallic faults when the fault voltage in all phases is very low or zero and the relay cannot use it to detect the direction of the fault current.

An unconventional source has a very low inertia (wind-powered induction generators) or no mechanical inertia at all (inverter-based sources). During fault conditions, the source voltage phase angle may change considerably with respect to the pre-fault angle. Also, an inverter-based source may incorrectly measure the system frequency during fault conditions. If so, the source may supply voltages and currents at a frequency that is unintentionally different from the pre-fault frequency. If a mho distance element uses the pre-fault (memory) voltage angle and extrapolates it based on the pre-fault frequency while the source operates at a different frequency than the pre-fault frequency, then the polarization gradually becomes incorrect with the passing of time. Incorrect memory polarization may result in a loss of security (reverse faults appear forward) or a loss of dependability (forward faults appear reverse). A distance element may pick up and drop out repeatedly when using an incorrect polarizing voltage. This chattering may prevent time-delayed operation in a step distance backup protection application.

As discussed above, unconventional sources respond to fault conditions in certain quantities such as current, voltage, frequency and the like differently than synchronous generators. However, certain other quantities may be useful for fault location even during faults fed by unconventional sources. For example, FIG. 2C illustrates traces of the apparent resistance 214 and apparent reactance 212 for the B-phase-to-ground fault of FIGS. 2A and 2B. Significantly, the apparent impedance is relatively constant, and it correctly reflects the distance to the fault. In the illustrated example, the line impedance 216 is about 7.40 secondary and the fault is located at about 30 percent of the line length from the terminal. Accordingly, several embodiments herein use apparent impedance to determine a distance to the fault. Apparent impedance is used instead of traditional methods of fault distance calculation such as polarizing with memory voltage or negative-sequence current.

Apparent impedance is calculated using the current and voltage measured at the IED. In various embodiments, the apparent impedance may be calculated using phasor values. For example, dividing the measured voltage phasor by the measured current phasor yields the apparent impedance. It should be noted, however, that in typical power system protection phasors are calculated using cosine or Fourier filters. Apparent impedance calculated using phasors is, therefore, frequency dependent, and typically represents energy at around the fundamental power system frequency. As discussed and illustrated herein, during faults the voltages and currents supplied by unconventional sources can be low and distorted. The voltages and currents may have their energy spread out across a frequency spectrum instead of being concentrated at the power frequency. By using signal energy from a broader spectrum instead of from a narrow band around the power frequency, apparent impedance measurement can be improved.

In some embodiments, apparent impedance may be calculated from instantaneous loop voltage (v) and current (i) using parameter-fitting principles. The apparent resistance (R) and the apparent inductance (L) are values that—together as a pair—fit the measured voltage to the expected voltage derived from the current. In one embodiment, the apparent resistance and inductance values that minimize the objective function of Equation 1 are the values used to calculate apparent impedance:

$$\int_{T_0}^{T}\left(v - R\cdot i - L\frac{di}{dt}\right)^2 dt \qquad \text{Eq. 1}$$

Where the interval from $T_0$ to T is the observation period, $T_0$ is the fault inception time, which may be delayed by several milliseconds to flush out the initial transients that do not reflect the R-L nature of the measurement loop, and T is the most recent time (time of the latest signal sample available in the IED).

The approach illustrated in Equation 1 is the least-error squared fit of the parameters of the process (R, L) to the measurements (v, i). Traditional distance protection applies polarization with the voltage (mho) and the sequence currents (quadrilateral) instead of using apparent impedance. Several advantages may be realized by using apparent impedance calculated using Equation 1 in applications near unconventional sources.

First, the approach using Equation 1 allows extending the measurement window with the passing of time to progressively gain accuracy despite signal distortions and interfering signals. For example, consider a window that starts at $T_0=5$ ms after the fault inception. When T=25 ms (25 ms after the fault inception), the window is 20 ms long; when T=26 ms, the window is 21 ms long, and so on. The distance element may intentionally take a longer time to operate to gain better accuracy of the apparent impedance measurement. For example, 40 ms into the fault, the relay uses a window that is 35 ms long in the present example.

Second, the approach using Equation 1 uses the signal energy contained in a wider spectrum of at least a few hundred hertz—the spectrum allowed by the low-pass filter applied to the instantaneous voltages and currents. The total energy contained in the spectrum is higher than the energy carried in the phasors in the narrow band around the power system frequency. By working with signals of higher energy, this approach allows better measurement accuracy.

Third, the approach using Equation 1 does not depend on the system frequency or on the measurement of the system frequency. Accordingly, genuine changes in system frequency, or frequency measurement lag, or errors do not affect this method. Additionally, the approach is a constant inductance method, and it maintains a constant distance element reach even when the system frequency is different than nominal.

The approach using Equation 1 may be implemented in several ways such as is described below. The continuous-time Equation 1 may be translated using a two-point numerical derivative into discrete-time format for application in a microprocessor-based IED as illustrated in Equations 2a, 2b, and 2c:

$$\frac{1}{\omega}\frac{di(t)}{dt} \rightarrow i_{DER(p)} = \frac{f_S}{2\pi \cdot f_N}(i_{(p)} - i_{(p-1)}) \qquad \text{Eq. 2a}$$

$$i(t) \rightarrow i_{AVR(p)} = \frac{1}{2}(i_{(p)} + i_{(p-1)}) \qquad \text{Eq. 2b}$$

$$v(t) \rightarrow v_{AVR(p)} = \frac{1}{2}(v_{(p)} + v_{(p-1)}) \qquad \text{Eq. 2c}$$

Where $f_N$ is the nominal system frequency, fs is the relay sampling frequency, and p is an index of a current or voltage sample.

Operations 2b and 2c ensure that the voltage, current, and the current derivative all have the same group delay.

In the discrete-time domain, Equation 1 becomes Equation 3:

$$\sum_{n=k-N0}^{n=k} (v_{AVR(n)} - R \cdot i_{AVR(n)} - X \cdot i_{DER(n)})^2 \qquad \text{Eq. 3}$$

Where X is the apparent reactance at the nominal system frequency ($X=2\pi \cdot f_N \cdot L$), k is the present (newest) sample index, and N0 is the data window length (fixed or variable).

The following (R, X) values bring the objective function in Equation 3 to its minimum and are therefore the outputs of the measurement algorithm:

$$R_{(k)} = \frac{D_{(k)} \cdot C_{(k)} - B_{(k)} \cdot E_{(k)}}{A_{(k)} \cdot C_{(k)} - B_{(k)}^2} \qquad \text{Eq. 4a}$$

$$X_{(k)} = \frac{A_{(k)} \cdot E_{(k)} - B_{(k)} \cdot D_{(k)}}{A_{(k)} \cdot C_{(k)} - B_{(k)}^2} \qquad \text{Eq. 4b}$$

Where:

$$A_{(k)} = \sum_{n=k-N0}^{n=k} i_{AVR(n)}^2 \qquad \text{Eq. 5a}$$

$$B_{(k)} = \sum_{n=k-N0}^{n=k} i_{AVR(n)} \cdot i_{DER(n)} \qquad \text{Eq. 5b}$$

$$C_{(k)} = \sum_{n=k-N0}^{n=k} i_{DER(n)}^2 \qquad \text{Eq. 5c}$$

$$D_{(k)} = \sum_{n=k-N0}^{n=k} i_{AVR(n)} \cdot v_{AVR(n)} \qquad \text{Eq. 5d}$$

$$E_{(k)} = \sum_{n=k-N0}^{n=k} i_{DER(n)} \cdot v_{AVR(n)} \qquad \text{Eq. 5e}$$

A microprocessor-based IED may implement the time-domain wide-spectrum apparent impedance calculation using the above method. The IED may execute equations 2a, 2b, and 2c, which are equations for simple two-tap finite impulse response filters. The IED may calculate the accumulated sums in Equations 5a-5e. The IED may then calculate the apparent impedance using Equations 4a and 4b. Finally, using geometry, the IED may verify if the apparent impedance is inside or outside of the operating characteristic, such as in FIGS. 3A, 3B, and 5 (discussed hereafter).

The voltage (v) and current (i) inputs are instantaneous loop voltages and currents and may be calculated first from the phase instantaneous quantities according to the principles of six-loop distance protection for three-phase systems. The current signal (i) in Equations 2a-2c is a measured value and does not need to nor should it be filtered with the mimic (dc removal) filter.

The time-domain wide-spectrum apparent impedance approach is especially beneficial when measuring phase-to-phase apparent impedances because of the very low phase-to-phase currents supplied by unconventional sources during phase faults (very high system impedance ratio for phase faults). It shall be understood that this invention is not limited to using the time-domain wide-spectrum apparent impedance measurement. Phasor-based apparent impedance measurement may be used as well while achieving other benefits of this embodiments described herein, except the better accuracy as it relates to weak source phenomena.

Apparent impedance may be used to determine fault distance using distance operating characteristics such as mho operating or quadrilateral operating characteristics. However, use of apparent impedance instead of traditional polarization may be unreliable in detection of fault direction in certain situations. For example, for close-in bolted faults, the measured voltage is very low or zero, preventing the apparent impedance distance element from detecting the fault direction.

Accordingly, several embodiments herein use apparent impedance with a nondirectional distance operating characteristic to determine fault distance. In several embodiments, the nondirectional distance element may include an offset distance characteristic. Such an operating characteristic may be offset in the reverse direction so that it includes the origin of the apparent impedance plane, resulting in a distance element that is dependable but is nondirectional (would operate for both close-in forward and reverse faults).

Figure 3A:
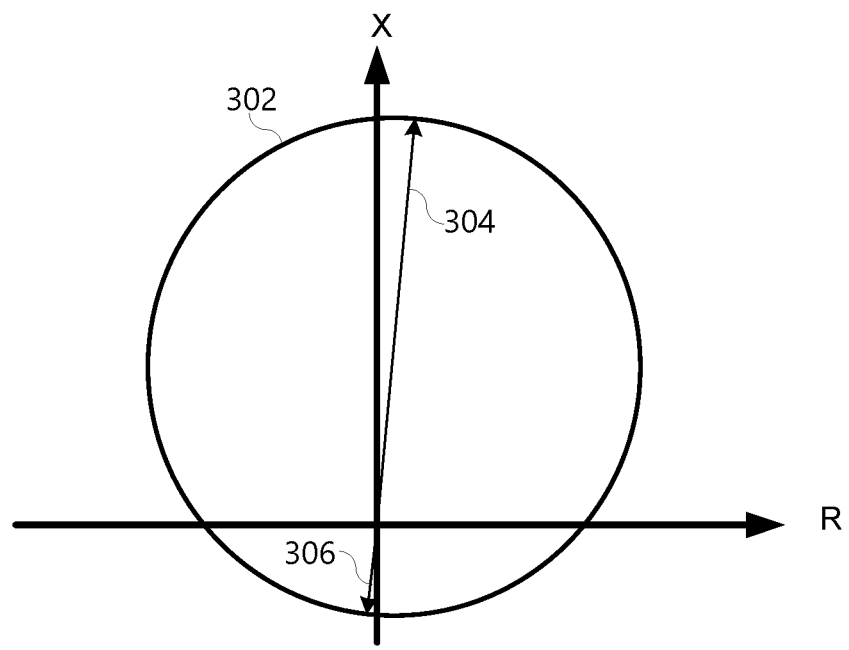
FIGS. 3A and 3B illustrates offset (nondirectional) distance characteristics on the apparent impedance plane.
Figure 3B:
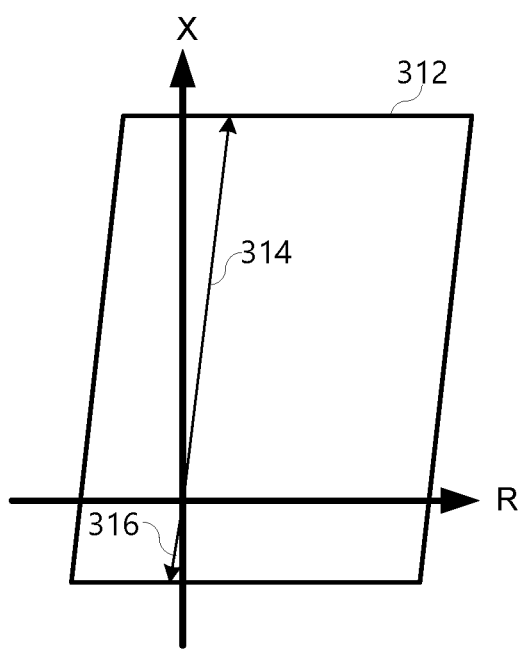

FIGS. 3A and 3B illustrate offset (nondirectional) distance operating characteristics that may be used in accordance with several embodiments herein. In particular, FIG. 3A illustrates a circular (mho) characteristic 302 that is offset in the reverse direction to include the origin of the apparent impedance (reactance-resistance) plane. The characteristic is defined by both forward 304 direction reach and reverse 306 direction reach.

FIG. 3B illustrates an offset (nondirectional) apparent-impedance quadrilateral operating characteristic 312 that may be used in various embodiments herein. The quadrilateral characteristic 312 is offset to include the origin, and covers forward faults with the forward 314 direction reach and reverse faults with the reverse 316 direction reach.

The offset apparent-impedance operating characteristics may be modified as needed to account for various system attributes. For example, the fault resistance coverage may be controlled using the resistive (right) blinder setting of the quadrilateral characteristic in FIG. 3B. Furthermore, the reactance characteristic (top line of the rectangle) of FIG. 3B may be tilted down to avoid zone 1 overreaching for resistive faults, or tilted up to overreach the remote terminal in zone 2 applications.

Reverse reach can be set to dependably include the origin of the impedance plane. Reverse reach settings may be on the order of 10 to 30 percent of the line impedance. The right blinder of the quadrilateral characteristic can be set following line loadability criteria. The distance operating characteristics used herein may be self-polarized in that they only use the loop voltage and current. An IED such as that illustrated in FIG. 1 may be configured to shape these characteristics by using the distance comparator convention. In other embodiments, the IED may derive the apparent impedance value and compare it (using basic geometry) with the operating contour on the impedance plane. That is, when the apparent impedance value is within the operating characteristic, an internal fault is detected.

As has been indicated above, the nondirectional distance operating characteristics used herein are non-directional. Directional distance protection used near unconventional sources should prefer directional logic that is independent from the source fault current contribution. Accordingly, several options are presented for directional logic useful in distance protection. In particular, forward-looking zero-sequence directional logic, weak-infeed directional logic, and/or incremental-quantity directional logic may be used.

For ground faults, zero-sequence directional logic may be used to verify a fault in the forward direction. An unconventional source requires a step-up transformer for connecting a subtransmission and transmission voltage level system. The system-side winding of the step-up transformer is typically configured as wye and grounded. This allows line protection to measure reliable zero-sequence current and voltage for phase-to-ground faults.

The zero-sequence impedance of the step-up transformer ties together the zero-sequence voltage and current. The zero-sequence voltage follows the current even if the system swings or the frequency shifts. The angle between the zero-sequence voltage and current identifies the ground fault direction with great security and dependability. Because the zero-sequence network is passive and excited only at the fault point (single-pole open condition notwithstanding), the zero-sequence voltages and currents are greatly independent of the unconventional sources, power swings, and frequency excursions.

The zero-sequence directional logic may correctly assert in the forward direction for line faults, and is therefore useful to provide directionality for phase-to-ground faults. Accordingly, in certain embodiments, a determination of forward direction for phase-to-ground faults using forward-looking zero-sequence directional logic may be used to provide directionality to the ground offset distance characteristic. Directionality may be used in a permissive manner in the distance element. A different directional element may be needed for phase offset distance elements to address phase-to-phase and three-phase faults.

Figure 4A:
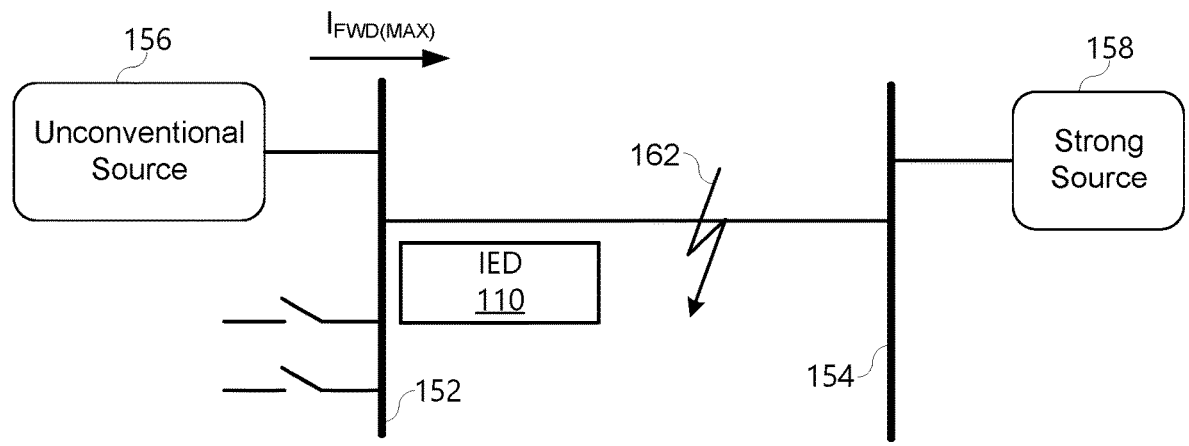
FIGS. 4A and 4B illustrate one-line diagrams of electric power delivery systems with unconventional sources feeding a fault in a forward direction and in a reverse direction.
Figure 4B:
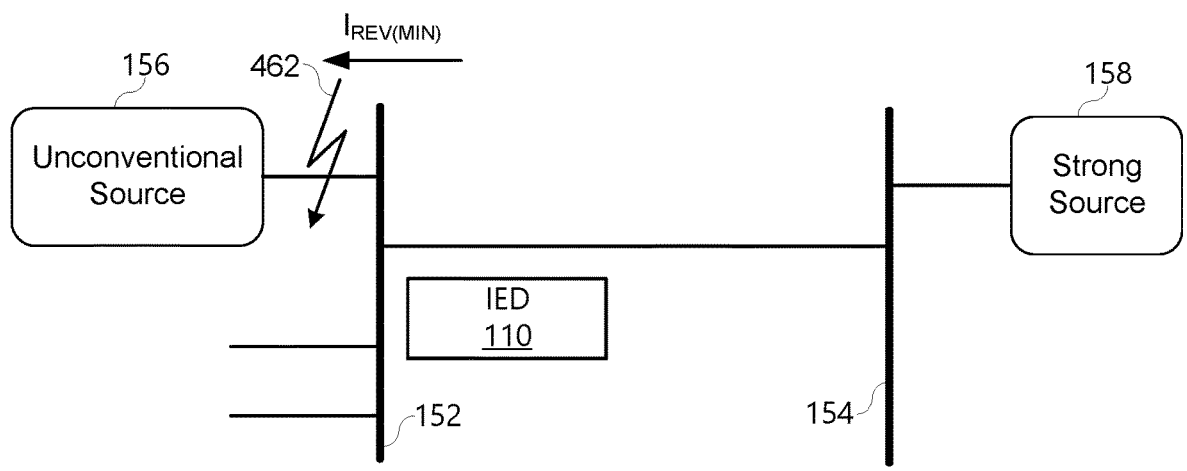

In accordance with various embodiments, weak-infeed directional logic may be used to assist with directionality in a distance element for phase-to-phase faults. The weak-infeed directional logic used herein relies on the remote strong source to feed reverse faults for reliable determination of the reverse direction. FIGS. 4A and 4B illustrate simplified one-line diagrams of an electrical power system such as is illustrated in FIG. 1, to better understand the sources that feed forward and reverse faults in a system with unconventional sources. As can be seen, a fault 162 that is in the forward direction from IED 110 will be fed by both the remote strong source 158 and the local unconventional source 156. The IED 110 is positioned between the unconventional source 156 and the fault 162. Accordingly, the current and voltage signals observed by IED 110 will be related to power fed to the fault 162 by the unconventional source 156. As is described above, the frequency, voltage, and current obtained from such signals may by considerably different from traditional values, and cannot be relied upon for determining a direction of phase-to-phase faults or three-phase faults using traditional methods.

However, as is seen in FIG. 4B, in the event of a reverse fault 462, the IED is between the strong source 158 and the fault 462. Accordingly, the system (not the unconventional source) maintains the voltage at the line terminal 152 and drives the fault current observed at IED 110. The pre-fault voltage (memory voltage) is therefore an adequate representation of the electromotive force that pushes the current toward the reverse fault 462. Thus, the currents and voltages observed at the IED 110 may be reliably used to determine a fault direction as reverse.

For dependability, the weak-infeed directional logic should not assert for forward faults (e.g. 162) when the unconventional source is the dominant source supplying the fault current. During such forward faults, the memory polarization can be greatly inaccurate, and the operating current may have an unusual phase angle. An overcurrent principle may be used to ensure that the weak-infeed directional logic stays deasserted for forward faults in a system configuration in which the unconventional source dominates the fault current.

The maximum forward fault current $I_{FWD(MAX)}$ is shown for a forward fault 162 fed by the unconventional source 156, as well as the minimum reverse current $I_{REV(MIN)}$ for a reverse fault 462 fed by the strong source 158. When supplied exclusively by the unconventional source 156, the forward fault current $I_{FWD(MAX)}$ is low relative to the reverse fault current $I_{REV(MIN)}$ supplied by the system. Accordingly, an overcurrent threshold set below the minimum reverse fault current $I_{REV(MIN)}$ but above the maximum forward fault current $I_{FWD(MAX)}$, may be used to enable the weak-infeed direction logic. A weak-infeed overcurrent threshold 50WID may be selected in accordance with the following setting criterion:

$$1.25 \cdot I_{FWD(MAX)} < 50WID < 0.8 \cdot I_{REV(MIN)} \qquad \text{Eq. 6}$$

This setting criterion assumes a 25 percent margin, and this is typically not difficult to satisfy because unconventional sources are weak compared with the bulk of the system connected to the remote terminal 154. Setting the weak-infeed overcurrent threshold properly is needed for the operation of the weak-infeed logic. The weak-infeed directional logic responds reliably to reverse faults because the directional principle holds for those faults. The low-current condition effectively blocks the weak infeed logic for forward faults when the unconventional source challenges the directional principle. If the local terminal 152 is not weak, then the overcurrent threshold may be met (due to the strong source supplying the fault) even for forward faults and may permit the weak-infeed directional logic. However, the weak-infeed directional logic will respond correctly because the terminal is no longer weak and unconventional.

Figure 5:
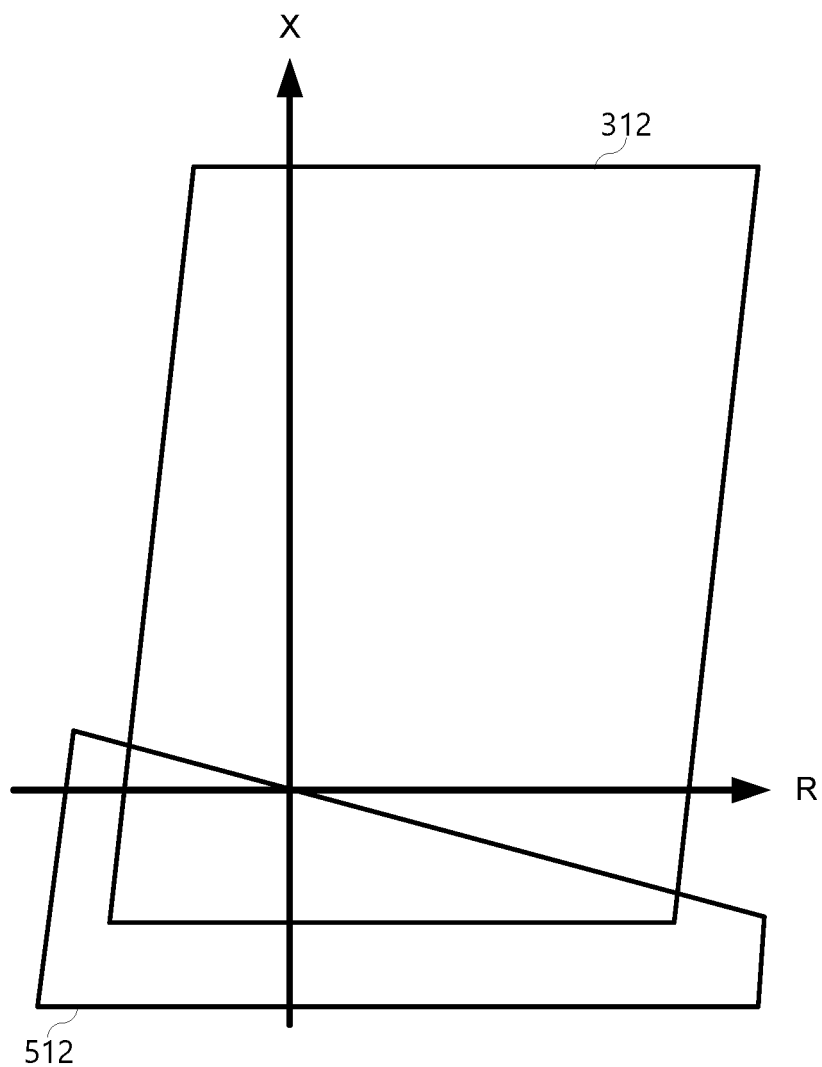
FIG. 5 illustrates a plot of an offset distance characteristic and a reverse characteristic in accordance with several embodiments herein.

FIG. 5 illustrates a plot of an offset quadrilateral distance operating characteristic 312 and a reverse quadrilateral characteristic 512 that may be used together to determine fault distance and direction. Indeed, a reverse-looking phase distance element using the reverse characteristic 512 may be used to detect a reverse direction and block the nondirectional characteristic 312 resulting in a forward-looking distance element.

The weak-infeed directional logic may be made up of an overcurrent supervision that includes the weak-infeed overcurrent threshold 50WID as described above, and a reverse-looking distance element. The reverse-looking reach of the reverse distance characteristic 512 may be set greater than the reverse reach in the offset distance characteristic 312. Accordingly, a fault direction may be determined as reverse when the weak-infeed overcurrent threshold is met (the observed measurements are supplied by the strong source) and the reverse distance characteristic is satisfied. The weak-infeed reverse determination may be used in a blocking manner for the nondirectional distance characteristic in order to prohibit protective actions for reverse faults.

Figure 6:
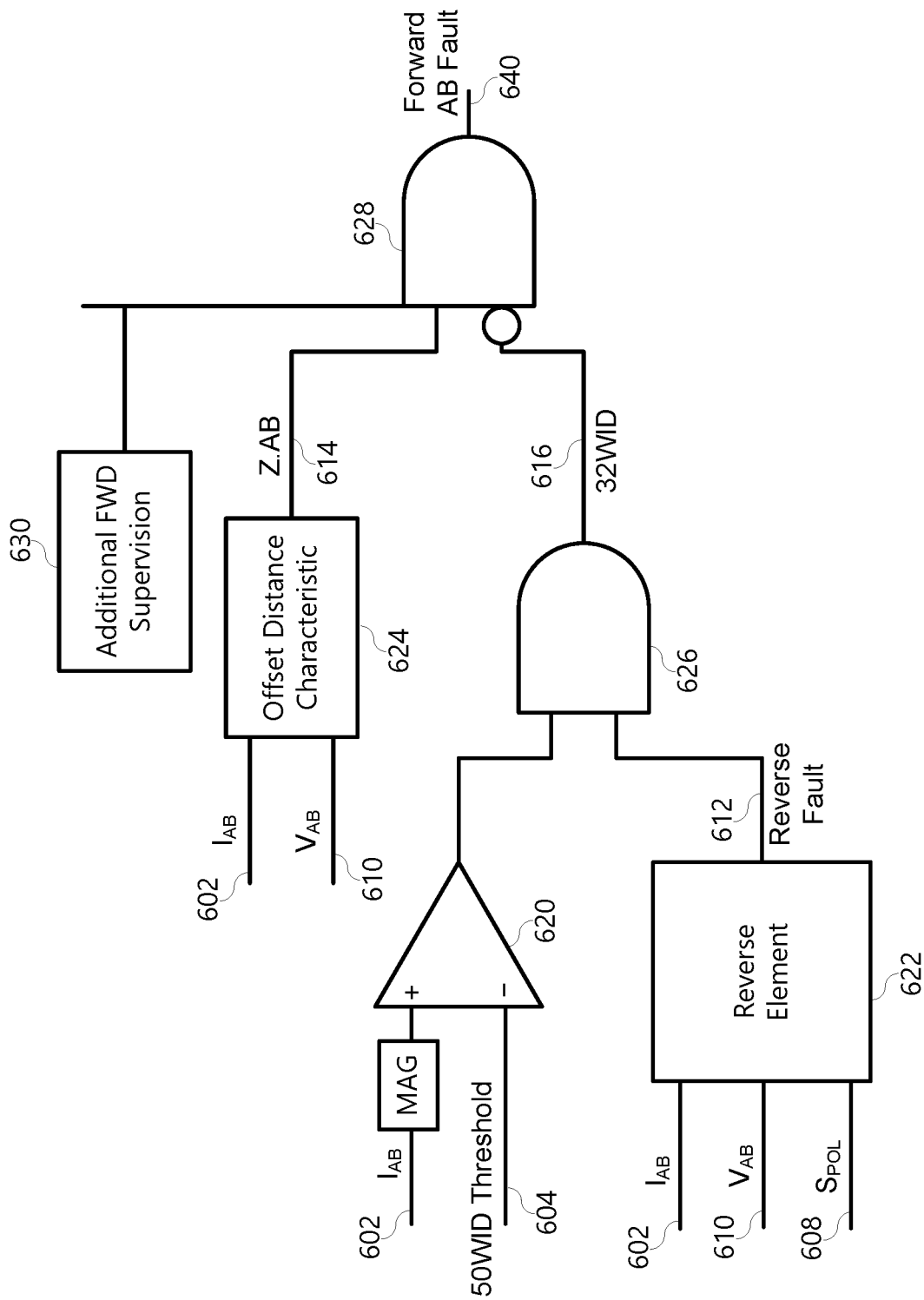
FIG. 6 illustrates a simplified logic diagram that may be used for weak-infeed forward fault detection accordance with several embodiments herein.

FIG. 6 illustrates a simplified logic diagram of an embodiment of the weak-infeed directional logic in cooperation with the offset distance characteristic to determine a forward phase-to-phase fault in the zone of protection in accordance with several embodiments herein. The embodiment is illustrated for the A-B phase fault loop. Similar logic may be applied for each of phase-to-phase fault loops.

When a magnitude of the phase-to-phase loop current 602 exceeds the predetermined weak-infeed overcurrent threshold 604, then comparator 620 asserts to AND gate 626. The current 602 and voltage 610 signals are used to determine a reverse fault 612 using a reverse characteristic 622. The reverse fault direction 612 may be determined by comparing an apparent impedance with a reverse distance characteristic as described above. In various other embodiments, a reverse direction may be determined by comparing an operating signal (calculated using loop currents 602 and voltages 610) and polarizing signal SPOL 608. AND gate 626 asserts the weak-infeed reverse directional signal 616 when the reverse fault 612 signal is present and the loop current 602 exceeds the weak infeed overcurrent threshold 604. The weak-infeed reverse directional signal 616 is used in a blocking manner in AND gate 628.

The loop current 602 and loop voltage 610 may be used to determine a fault within the zone of protection by calculating an apparent impedance from the loop current 602 and loop voltage 610 and comparing the resultant apparent impedance with an offset (nondirectional) distance operating characteristic 624. The offset distance characteristic 624 may be set to include both forward and reverse directions, as described above. When the apparent impedance is within the offset distance characteristic 624, then an apparent-impedance distance characteristic signal Z.AB 614 is asserted.

The distance element may include additional forward supervision 630. The additional forward supervision 630 may include an overcurrent supervision for the loop to ensure that the loop current exceeds an overcurrent threshold. The additional forward supervision 630 may include fault identification supervision to enable the faulted loop. Various embodiments of fault identification are described hereafter. The additional forward supervision 630 may include a time-domain permissive supervision bit based on incremental quantities. Various embodiments of time-domain permissive supervision are described hereafter. Upon assertion of the apparent-impedance characteristic signal Z.AB 614 and the additional forward supervision 630 (if any) and non-assertion of the reverse weak-infeed direction 616, AND gate 628 asserts a distance forward fault determination for the AB loop 640. As described in more detail hereafter, the IED may determine a protective action for the determined distance to fault, and may instigate the protective action on the electric power delivery system.

Another method for determining a direction to the fault uses incremental quantities of power system measurements. An incremental-quantity directional element responds to changes in voltages and currents with respect to the steady-state pre-disturbance values. It has been observed that systems with unconventional sources exhibit inductive responses for sufficiently long time for incremental-quantity directional elements to determine fault direction. Accordingly, directional elements using incremental-quantity principles can correctly determine fault direction even when applied near unconventional sources.

Figure 7:
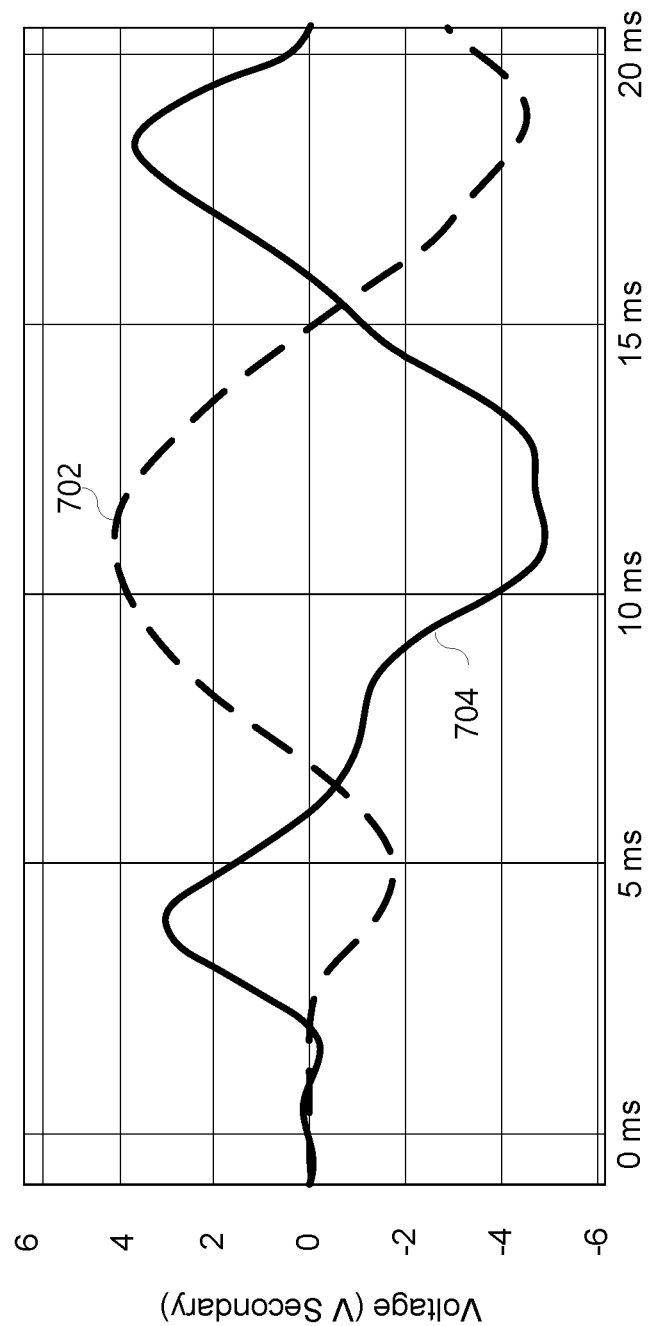
FIG. 7 illustrates a plot of incremental voltage and incremental replica current calculated during a fault on an electric power delivery system with an unconventional source feeding the fault.

FIG. 7 illustrates a plot of the incremental voltage 702 and the incremental replica current 704 during the first 20 ms after instantiation of a disturbance at time 0. The illustrated disturbance is a fault from B-phase to ground, but similar results are expected for ant phase-to-ground or phase-to-phase loop. It can be seen that the polarities of the incremental voltage and incremental replica current are opposite. Opposite polarities of incremental voltage and incremental replica current on the faulted loop are expected for a fault in the forward direction. Matching polarities of incremental voltage and incremental replica current on the faulted loop are expected for a fault in the reverse direction. Accordingly, incremental-quantity directional elements determine fault direction by comparing the polarities of the incremental voltage and incremental replica current during the first few milliseconds following a fault.

Incremental-quantity directional elements may be used in various ways to directionalize the offset impedance characteristics in embodiments herein. For phase-to-ground faults, the incremental-quantity directional element may be used together with or in place of the forward-looking zero-sequence directional element to directionalize the ground offset distance characteristic. For phase-to-phase faults, the incremental-quantity directional element may be used together with or in place of the weak-infeed distance logic to directionalize the phase offset distance characteristic.

The forward-looking zero-sequence directional element may be used in a permissive manner (forward assertion allows operation of the protection element), while the weak-infeed logic may be used in a blocking manner (reverse assertion blocks operation of the protection element). In various embodiments, a forward assertion of the incremental-quantity directional element may be used to supervise the forward-looking distance elements (permissive logic). Similarly, a reverse assertion of the incremental-quantity directional element may be used to block the forward-looking distance elements (blocking logic).

Figure 8A:
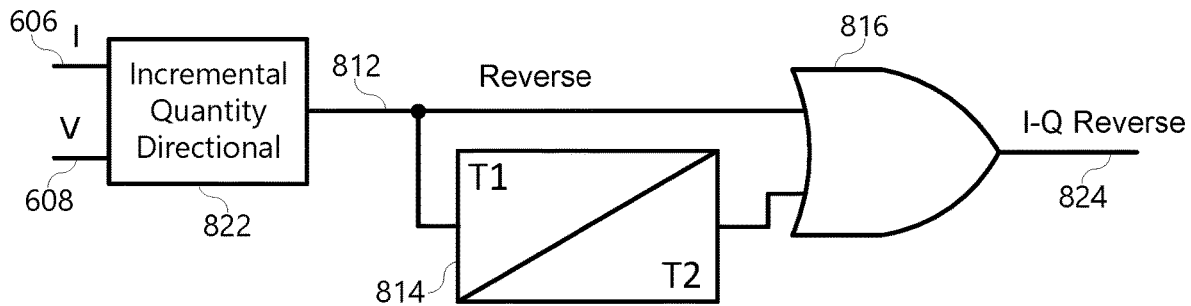
FIGS. 8A, 8B, and 8C illustrate logic diagrams useful for determining a direction to a fault in an electric power delivery system in accordance with several embodiments herein.
Figure 8B:
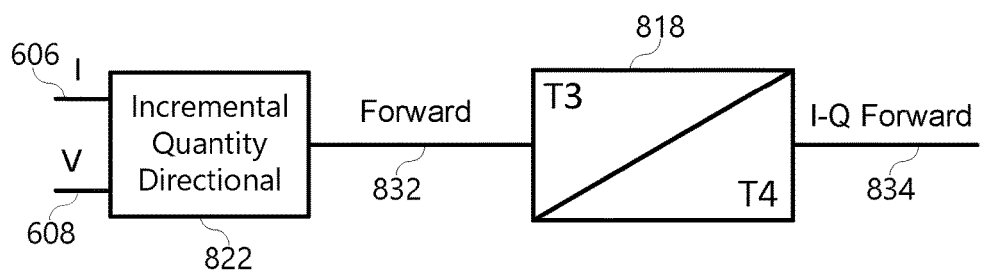

FIGS. 8A and 8B illustrate simplified logic diagrams for asserting incremental-quantity directional determinations in accordance with several embodiments. Current and voltage measurements 606, 608 are provided to an incremental-quantity directional block 822. The incremental-quantity block 822 uses the current and voltage signals 606, 608 to calculate incremental voltage and incremental replica current, and compare polarities thereof. When the polarities are matching, then a reverse signal 812 is asserted. When the polarities are opposite, then a forward signal 832 is asserted.

Because the incremental-quantity directional element only asserts momentarily and resets when the incremental signals expire, extension timers may be used. For example, once the reverse signal 812 is asserted for a pickup time T1, timer 814 asserts for time T2. OR gate 816 asserts the incremental-quantity directional reverse signal 824 upon assertion of the reverse signal 812 or assertion of the timer 814. Similarly, extension timer 818 asserts once the forward signal 832 persists for pickup time T3, and is extended for time T4 to produce the incremental-quantity directional forward signal 834. To avoid extending for a spurious assertion, the extension is only applied if the element 822 asserts for pickup time T3. In various embodiments, the pickup times T1, T3 may relatively short such as, for example, ⅛ or ¼ of a cycle. Extension times T2 and T4 may be longer than the worst-case fault clearing time for close-in reverse faults, including a breaker failure contingency.

In various embodiments, an incremental-quantity directional forward fault signal 834 may be deemed sufficient to supervise the distance element (permitting protective action). In various other embodiments, both the presence of the incremental-quantity forward fault signal 834 and absence of the incremental-quantity directional reverse fault signal 824 are required for supervising the distance element (permitting protective action).

Figure 8C:
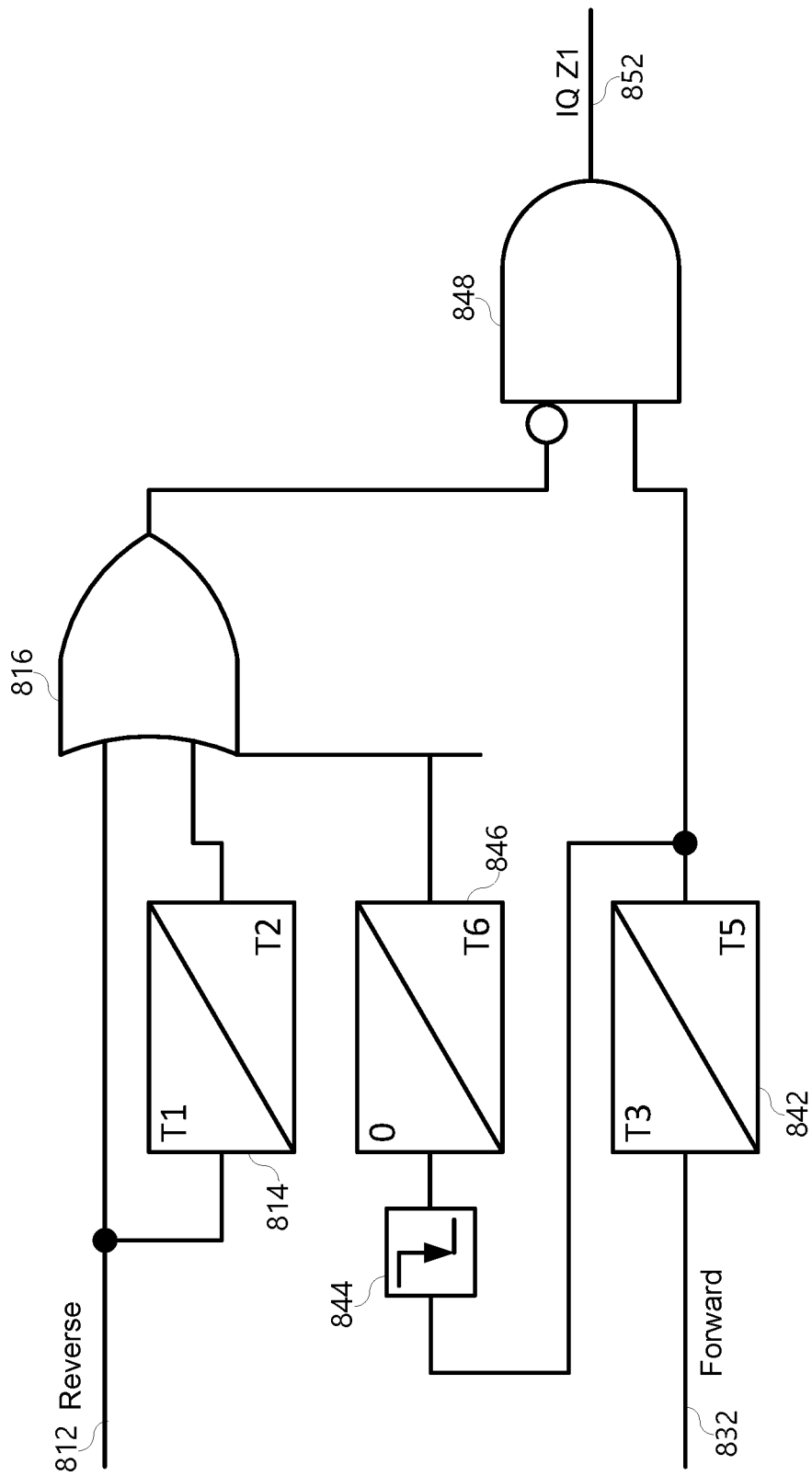

Underreaching distance protection applications herein may use incremental-quantity directional logic to supervise the nondirectional operating characteristic. In various applications, it may be beneficial to disable the underreaching zone before the frequency deviation of a low-inertia source causes an overreach. The temporary engagement of the zone 1 distance element can be controlled by a disturbance detection logic or a starting zone, or it can use the incremental-quantity directional element for directional supervision and for opening and closing the zone 1 operating window. FIG. 8C illustrates a simple logic diagram suitable for underreaching applications. The forward fault signal 832 asserts to timer 842. The timer 842 with dropout time T5 on the order of 2 to 3 power system cycles allows the distance element to respond to an in-zone fault by asserting to AND gate 848 (which asserts the incremental quantity directional time-limited permissive supervision bit IQ Z1 852). The zone 1 element is disabled before frequency deviations can cause an overreach for out-of-zone faults; once the T5 2 to 3 power system cycle operating window closes, the zone 1 element is disabled for the duration of the dropout time T6 of timer 846 (on the order of 1 second). Disabling may occur by assertion of the incremental quantity reverse fault direction signal 812 or upon deassertion of timer 842 (by signal inverter 844 and timer 846 asserting to OR gate 816).

As indicated above, the distance elements herein may further include faulted loop identification logic. Unconventional sources supply fault currents that contain the negative-sequence components that does not follow the negative-sequence voltage and by extension the zero-sequence current. This may be a problem for traditional faulted loop selection. However, unconventional sources are weak (supply low fault current and cannot maintain voltage in the faulted phases). When an unconventional source supplies the fault current, the voltage in the faulted loop decreases considerably compared with the nominal voltage and compared with the voltages in the healthy loops. Therefore, an undervoltage logic can reliably select the faulted loop. The faulted-loop selection logic can be designed to allow a distance protection loop to operate if the loop voltage is below a certain threshold. In other embodiments, the faulted-loop logic can be designed to select the loop with the lowest loop voltage.

Figure 9A:
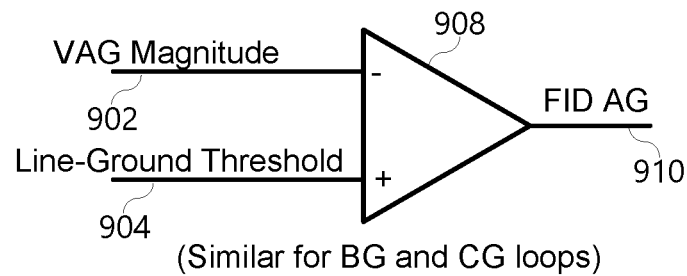
FIGS. 9A and 9B illustrate logic diagrams useful for faulted loop selection in accordance with several embodiments herein.
Figure 9A:
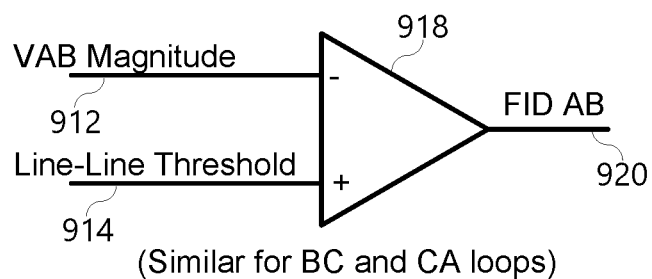
Figure 9B:
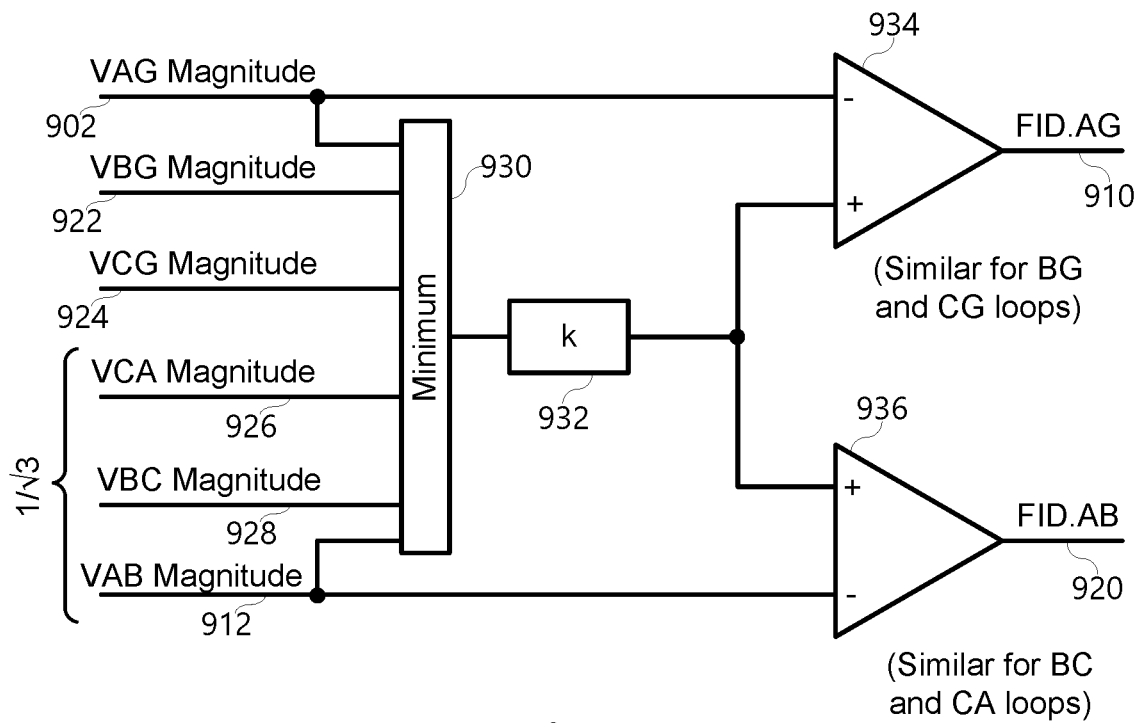

FIGS. 9A and 9B illustrate logic diagrams that use voltage signals for faulted loop selection. FIG. 9A illustrates logic for determining an A-phase-to-ground fault loop by comparing the A-phase-to-ground voltage magnitude 902 with a predetermined line-to-ground voltage threshold 904. If the A-phase-to-ground voltage magnitude 902 falls below the line-to-ground voltage threshold 904, then comparator 908 asserts the A-phase-to-ground fault identification signal 910. Similar logic may be used for the B-phase-to-ground loop and the C-phase-to-ground loop. To determine AB fault loop, the AB voltage magnitude 912 is compared with a predetermined line-line voltage threshold 914. If the AB voltage magnitude 912 falls below the line-line voltage threshold 914, then comparator 918 asserts the AB fault identification signal 920. Similar logic may be used for the BC loop and the CA loop.

FIG. 9B illustrates logic that uses a factor (k, k>1) of the lowest fault loop voltage magnitude as the threshold for determining the fault loop. As illustrated, a minimum 930 of the voltage magnitudes of each phase-to-ground loop 902, 922, 924 and each phase-to-phase loop 926, 928, 912 is determined. The magnitudes may be multiplied by a compensation factor for proper comparison. For example, the illustrated phase-to-phase voltage magnitudes are multiplied by compensation factor $1/\sqrt{3}$. The minimum of the voltage magnitudes may be multiplied by a factor (k) 932 such as, for example, 1.1. The multiplier 932 may be used to ensure that if two or more loops have a similar loop voltage during a multi-phase fault, the faulted loop selection logic releases all of these loops and does not chatter by repeatedly releasing and blocking two or more loops. If the A-phase-to-ground voltage magnitude falls below the product of the minimum value and the multiplier k 932, then comparator 934 asserts the A-phase-to-ground fault identification signal 910. Similarly, if the AB voltage magnitude falls below the product of the minimum value and the multiplier k 932, then comparator 936 asserts the AB loop fault identification signal 920. Similar comparisons may be made for each of the possible fault loops.

Figure 10:
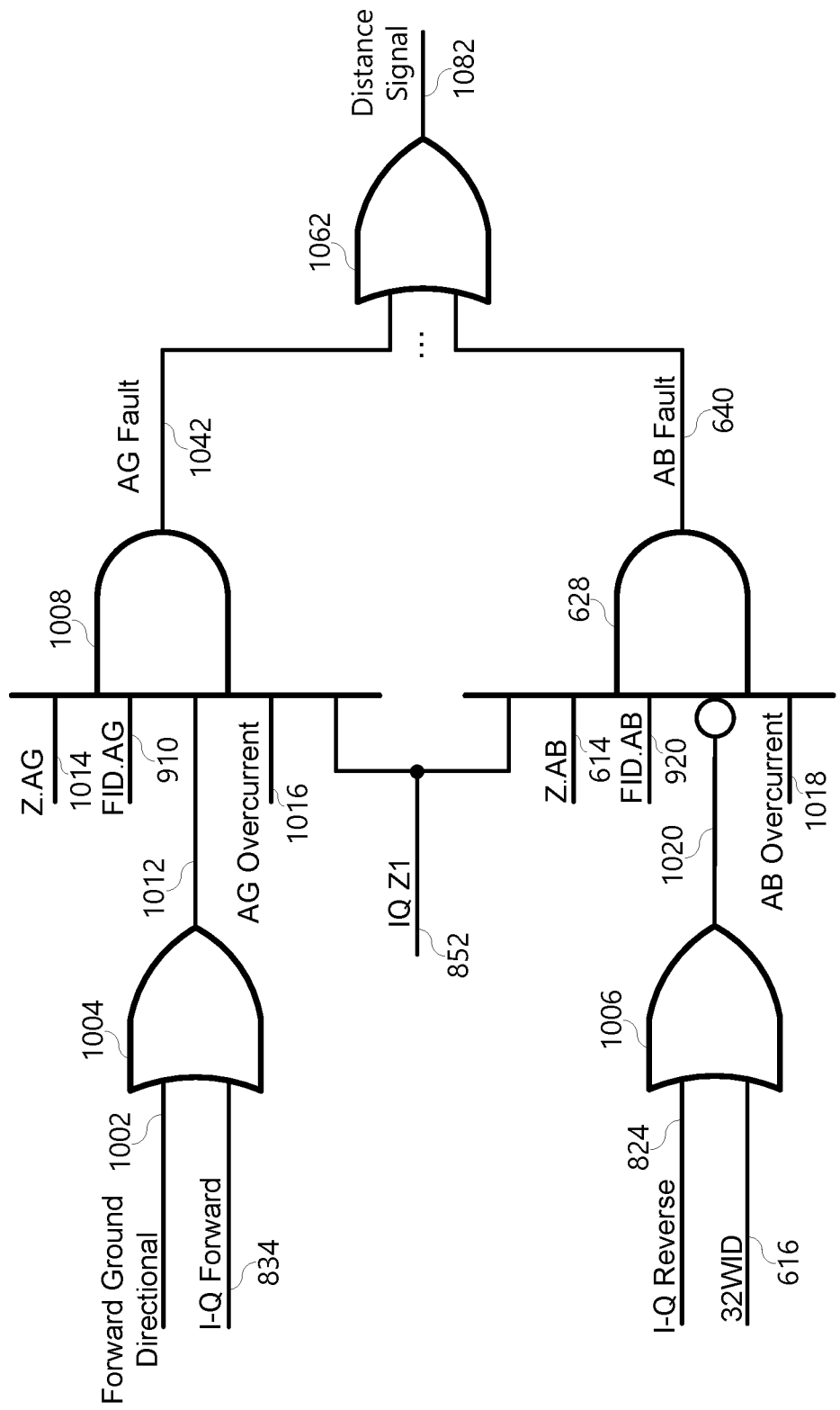
FIG. 10 illustrates a logic diagram useful for a distance element for protection in an electric power delivery system in accordance with several embodiments herein.

As suggested above, the present embodiments describe electric power system distance protection for use in systems with unconventional sources. The distance protection uses apparent-impedance in an offset (non-directional) distance characteristic, and is directionalized using weak-infeed directional logic, zero-sequence forward ground directional logic, and/or incremental-quantity directional logic. Distance protection may include further supervision as described above. FIG. 10 illustrates a simplified logic diagram for a directional element using the principles described herein. Although the illustrated logic is useful for A-phase-to-ground and AB phase directional protection, similar logic may be used for each of the possible fault loops.

For assertion of an A-phase-to-ground distance fault detection signal 1042, AND gate 1008 must receive the operating signal Z.AG 1014 from the apparent-impedance distance element, the AG fault loop identification signal 910, a directional supervisory signal 1012, a loop overcurrent signal 1016, and an incremental quantity directional time-limited permissive supervision signal 852. The incremental quantity directional time-limited permissive supervision signal 852 may be used for zone-1 protection. In various embodiments, the signal 852 is not necessary for overreaching distance protection. The signal Z.AG 1014 from the apparent-impedance distance element may be provided by comparing apparent impedance to an offset distance operating characteristic. Apparent impedance may be used to determine the distance fault condition using the offset distance characteristic similar to the phase-to-phase apparent impedance distance element described above.

The directional supervisory signal 1012 may be provided by either a forward ground directional signal 1002 from the zero-sequence directional logic described above OR 1004 by the incremental-quantity forward signal 834 described above. Accordingly, for phase-to-ground faults, the forward direction signal is used in a supervisory or permissive manner.

The A-phase-to-ground overcurrent signal 1016 may be asserted when the magnitude of the A-phase-to-ground current exceeds a predetermined overcurrent threshold.

For assertion of an AB distance fault detection signal 640, AND gate 628 must receive the signal Z.AB 614 from the apparent-impedance distance element, the AB fault loop identification signal 920, an AB loop overcurrent signal 1018, and the incremental quantity directional time-limited permissive supervision signal 852, while not receiving a reverse direction blocking signal 1020. Absence of the incremental-quantity reverse fault signal 824 and the weak-infeed reverse directional signal 616 are required at OR gate 1006 for assertion of signal 1020 to allow operation of AND gate 628 (assertion of either signal will block assertion of AND gate 628). The AB loop overcurrent signal 1018 may be asserted when the AB loop current magnitude exceeds a predetermined phase-to-phase overcurrent threshold.

Upon assertion of the A-phase-to-ground distance fault signal 1042, the B-phase-to-ground distance fault signal, the C-phase-to-ground distance fault signal, the AB distance fault signal 640, the BC distance fault signal, or the CA distance fault signal, OR gate 1062 asserts the distance fault signal 1082. A protective system may use the distance fault signal 1082 to determine a protective action and effect a protective action such as tripping a circuit breaker.

Figure 11:
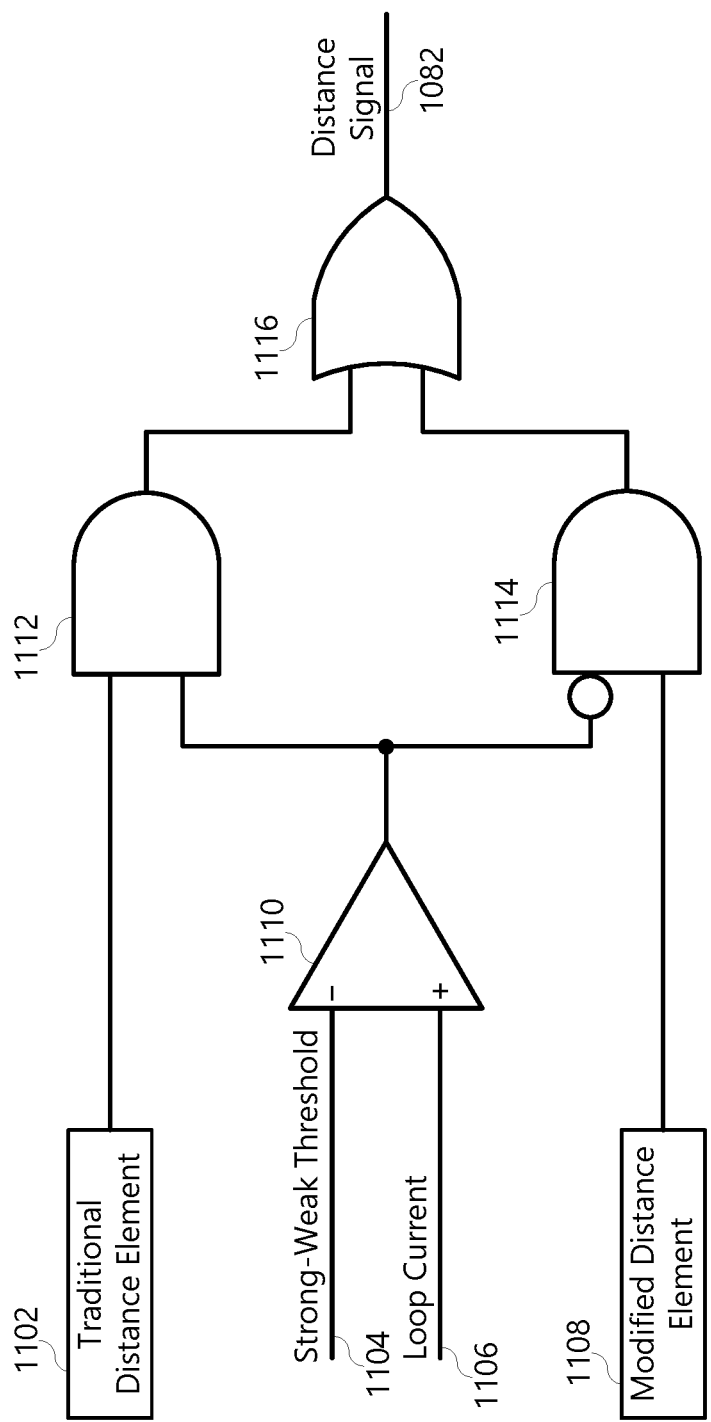
FIG. 11 illustrates a logic diagram for using traditional and modified distance elements in accordance with several embodiments herein.

It may be preferable to apply traditional distance elements to electric power systems (or portions thereof) in which traditional (strong) sources feed the fault. In such instances, an IED may be configured to make a determination each time a fault occurs as to whether to use traditional distance protection or the modified distance protection embodiments described herein. To that end, FIG. 11 illustrates a simplified logic diagram that may be used by an IED in the determination of whether to use traditional distance element principles 1102 or modified distance element principles 1108. The determination as illustrated is based on an overcurrent principle. The determination may be made on a per-fault-loop basis. The determination compares the loop current 1106 with a strong-weak current threshold 1104 in comparator 1110. The strong-weak current threshold should be higher than a current that an unconventional source would be expected to maintain for a fault condition. If the loop current 1106 for the selected fault loop exceeds the threshold 1104, and the traditional distance element 1102 asserts a distance fault signal for the selected fault loop, then AND gate 1112 asserts the distance fault signal for the selected fault loop. If, however, the loop current 1106 for the selected fault loop does not exceed the threshold 1104, and the modified distance element 1108 asserts a distance fault signal for the selected fault loop, then AND gate 1114 asserts the distance fault signal. Upon assertion of the distance fault signal from either AND gate 1112, 1114, OR gate 1116 asserts the distance fault signal 1082 useful for determining a protective action and asserting a protective action.

While specific embodiments and applications of the disclosure have been illustrated and described, it is to be understood that the disclosure is not limited to the precise configurations and components disclosed herein. Moreover, principles described herein may also be utilized for distance protection and directional overcurrent protection. Accordingly, many changes may be made to the details of the above-described embodiments without departing from the underlying principles of this disclosure. The scope of the present invention should, therefore, be determined only by the following claims.

What is claimed is:

1. An electric power delivery protection system, comprising:
    a data acquisition subsystem in electrical communication with an electric power delivery system, to acquire a plurality of current signals and voltage signals from multiple power system phases at a first location of the electric power delivery system;
    a distance protection element in communication with the data acquisition subsystem to receive the plurality of current signals and voltage signals and to assert a fault signal for a fault within a first zone of protection by:
        calculating an apparent impedance of a fault loop using the plurality of current signals and voltage signals;
        comparing the apparent impedance with an offset distance characteristic;
        when a current associated with the fault loop exceeds a predetermined weak-infeed threshold, calculating an operating signal using the current associated with the fault loop;
        comparing the operating signal with a polarizing signal to determine a reverse fault direction;
        when the reverse fault direction is not determined and the apparent impedance is within the offset distance characteristic, asserting the fault signal as a forward fault signal;
    a protection module in communication with the distance protection element, to:
        determine a protection action upon assertion of the forward fault determination; and
        effect the determined protective action on the electric power delivery system.

2. The system of claim 1, wherein the predetermined weak-infeed threshold is less than a minimum reverse fault current magnitude.

3. The system of claim 1, wherein the predetermined weak-infeed threshold is greater than a maximum forward fault current magnitude.

4. The system of claim 1, wherein the distance protection element asserts the forward fault determination only upon assertion of an additional forward supervision element.

5. The system of claim 4, wherein the additional forward supervision element comprises comparison of incremental quantities to determine a forward fault direction.

6. The system of claim 5, wherein the comparison of incremental quantities comprises comparison of polarities of incremental voltage and incremental replica current.

7. The system of claim 4, wherein the additional forward supervision when applied to an underreaching distance zone is limited to a time interval.

8. The system of claim 4, wherein the additional forward supervision element comprises a fault loop overcurrent supervision signal.

9. The system of claim 4, wherein the additional forward supervision element comprises a fault loop identification supervision signal.

10. The system of claim 1, wherein the distance protection element is further configured to:
    calculate an incremental voltage and incremental replica current;
    compare polarities of the incremental voltage and incremental replica current to determine fault direction; and
    assert the fault signal as forward based on the determined fault direction.

11. The system of claim 1, wherein the fault loop comprises a phase-to-phase fault loop.

12. An electric power delivery protection system, comprising:
    a data acquisition subsystem in electrical communication with an electric power delivery system, to acquire a plurality of current signals and voltage signals from multiple power system phases at a first location of the electric power delivery system;

a distance protection element in communication with the data acquisition subsystem to receive the plurality of current signals and voltage signals and to assert a fault signal for a fault within a first zone of protection by:
  determining a fault loop using the voltage signals;
  calculating an apparent impedance of the fault loop using the plurality of current signals and voltage signals;
  comparing the apparent impedance with an offset distance characteristic;
  calculating zero-sequence voltage and zero-sequence current using the plurality of current signals and voltage signals;
  determining a fault direction as forward when an angle between the zero-sequence voltage and zero-sequence current is less than a predetermined threshold;
  when the forward fault direction is determined and the apparent impedance is within the offset distance characteristic, asserting the fault signal as a forward fault signal;

a protection module in communication with the distance protection element, to:
  determine a protection action upon assertion of the forward fault determination; and
  effect the determined protective action on the electric power delivery system.

13. The system of claim 12, wherein the distance protection element asserts the forward fault determination only upon assertion of an additional forward supervision element.

14. The system of claim 13, wherein the additional forward supervision element comprises comparison of incremental quantities to determine a forward fault direction.

15. The system of claim 14, wherein the comparison of incremental quantities comprises comparison of polarities of incremental voltage and incremental replica current.

16. The system of claim 14, wherein the additional forward supervision element comprises a fault loop overcurrent supervision signal.

17. The system of claim 14, wherein the additional forward supervision element comprises a fault loop identification supervision signal.

18. The system of claim 12, wherein the distance protection element is further configured to:
  calculate an incremental voltage and incremental replica current;
  compare polarities of the incremental voltage and incremental replica current to determine fault direction; and
  assert the fault signal as forward based on the determined fault direction.

19. The system of claim 12, wherein the fault loop comprises a phase-to-ground fault loop.

20. An electric power delivery protection system, comprising:
a data acquisition subsystem in electrical communication with an electric power delivery system, to acquire a plurality of input current signals and voltage signals from multiple power system phases at a first location of the electric power delivery system;
a distance protection element in communication with the data acquisition subsystem to receive the plurality of current signals and voltage signals and to assert a fault signal for a fault within a first zone of protection by:
  determining instantaneous loop current and voltage signals from the plurality of input current signals and voltage signals during an observation window;
  calculating an apparent impedance as an apparent resistance and apparent reactance by minimizing a function of the determined instantaneous loop current and voltage over the observation window;
  comparing the apparent impedance with an offset distance characteristic;
determining a directionalizing signal using the plurality of input current and voltage signals;
  when the apparent impedance is within the offset distance characteristic, asserting the fault signal as a forward fault signal based on the directionalizing signal;
a protection module in communication with the distance protection element, to:
  determine a protection action upon assertion of the forward fault determination; and
  effect the determined protective action on the electric power delivery system.

21. The system of claim 20, wherein the directionalizing signal comprises a weak-infeed reverse directionalizing signal, and the forward fault signal is not asserted upon determination of the reverse directionalizing signal.

22. The system of claim 20, wherein the directionalizing signal comprises a forward zero-sequence ground directional signal, and the forward fault signal is asserted upon determination of the forward zero-sequence ground directional signal.

* * * * *